us008810058B2

(12) United States Patent
Albean

(10) Patent No.: US 8,810,058 B2
(45) Date of Patent: Aug. 19, 2014

(54) MULTI-USE INPUT

(75) Inventor: David Albean, Indianapolis, IN (US)

(73) Assignee: Enerdel, Inc., Greenfield, IN (US)

( * ) Notice: Subject to any disclaimer, the term of this patent is extended or adjusted under 35 U.S.C. 154(b) by 987 days.

(21) Appl. No.: 12/791,491

(22) Filed: Jun. 1, 2010

(65) Prior Publication Data

US 2011/0291739 A1 Dec. 1, 2011

(51) Int. Cl.
*H04B 3/56* (2006.01)
*H04B 3/50* (2006.01)

(52) U.S. Cl.
CPC ..... *H04B 3/50* (2013.01); *H04B 3/56* (2013.01)
USPC .............................................................. 307/1

(58) Field of Classification Search
CPC ................................. H04B 3/50; H04B 3/56
USPC .............................................................. 307/1
See application file for complete search history.

(56) References Cited

U.S. PATENT DOCUMENTS

| 4,247,867 | A | 1/1981 | Gomi et al. | |
| 5,724,007 | A | 3/1998 | Mar | |
| 5,929,749 | A | 7/1999 | Slonim | |
| 6,081,140 | A | 6/2000 | King | |
| 6,252,466 | B1 | 6/2001 | Kawamura | |
| 6,286,127 | B1 | 9/2001 | King et al. | |
| 6,294,949 | B1 | 9/2001 | Kojima et al. | |
| 6,577,883 | B1 * | 6/2003 | Ueda .......................... | 455/573 |
| 7,355,384 | B2 | 4/2008 | Faust | |
| 7,498,801 | B2 | 3/2009 | Faust | |
| 7,558,037 | B1 | 7/2009 | Gong et al. | |
| 7,579,811 | B2 * | 8/2009 | Sato et al. ................... | 320/134 |
| 8,036,717 | B2 * | 10/2011 | Suzuki et al. ................ | 455/573 |
| 8,054,047 | B2 * | 11/2011 | Chen et al. .................. | 320/162 |
| 2002/0167336 | A1 | 11/2002 | Jamieson et al. | |
| 2005/0134321 | A1 | 6/2005 | Ede | |
| 2006/0203399 | A1 | 9/2006 | Faccin | |
| 2007/0013361 | A1 * | 1/2007 | Burlak et al. ................ | 324/142 |
| 2007/0018611 | A1 * | 1/2007 | Anttila et al. ............... | 320/114 |
| 2008/0284404 | A1 * | 11/2008 | Burlak et al. ................ | 323/312 |
| 2008/0311955 | A1 * | 12/2008 | Kim et al. ..................... | 455/557 |
| 2009/0124299 | A1 * | 5/2009 | Suzuki et al. ................ | 455/573 |

FOREIGN PATENT DOCUMENTS

JP 2008-167286 7/2008

OTHER PUBLICATIONS

International Preliminary Report on Patentability for related application PCT/US2011/038376, Dec. 4, 2012, 7 pages.
International Search Report for related application PCT/US2011/038376, Feb. 9, 2012, 3 pages.
Written Opinion of the International Searching Authority for related application PCT/US2011/038376, Feb. 9, 2012, 5 pages.

* cited by examiner

*Primary Examiner* — Adi Amrany
(74) *Attorney, Agent, or Firm* — Faegre Baker Daniels LLP

(57) ABSTRACT

An interface is disclosed. The interface can include a single node that can be configured to receive a state signal and a serial communication signal. The interface can also include a switch circuit and a switch control circuit, where the switch control circuit is capable of being influenced by the receipt of the state signal or the serial communication signal at the single node and can set the state of the switch circuit based on the receipt of the state signal. Additionally, a switch buffer circuit is coupled between the switch and the switch control circuit, where the switch buffer circuit is configured to prevent the serial communication signal from activating the switch circuit. As such, both the state signal and the serial communication signal can be transmitted over a single node without adversely affecting the operation of pre-existing components.

10 Claims, 5 Drawing Sheets

100

300

110

110

MULTI-USE INPUT

FIELD OF TECHNOLOGY

The subject matter herein generally relates to multi-use inputs and in particular, to multi-use inputs for electronic devices.

BACKGROUND

In recent years, consumers have been using a greater number of portable devices using rechargeable batteries. While such units are convenient, these batteries must be periodically recharged. Generally, a portable device containing a rechargeable battery includes a charge controller that is coupled to the battery and to an input for receiving power from an external source. The charge controller, based on signals from the battery, typically controls the flow of current to the battery. To accommodate this scheme, multiple contacts between the battery and the charge controller are generally present. For example, one of the contacts may be an input, while another may be a ground connection. Other contacts may be available for transferring information, such as voltage conditions and operational data, from the battery to the charge controller.

As portable devices have become more complex, the number of required contacts has increased. However, such increases in the number of contacts have led to increases in the expense of manufacturing these systems and the likelihood of malfunctions.

SUMMARY

Embodiments of the invention concern electronic devices have multi-use inputs. In a first embodiment of the invention, an interface for coupling an electronic device to a power source control element for the electronic device is provided. The interface includes a single node that is configured to receive a state signal and a serial communication signal from the electronic device. The interface also includes a switch circuit that is configured for providing a control signal for the power source control element based on the state signal, where the switch circuit is capable of being influenced by the receipt of the state signal or the serial communication signal at the single node. Further, the interface includes a switch buffer circuit coupling the single node to the switch circuit and that includes an impedance network having a charge/discharge time constant that prevents the serial communication signal from activating the switch circuit.

In a second embodiment of the invention, a system is provided. The system includes an electronic device, a power source coupled to the electronic device, and a power source control component for controlling the power source. The system further includes a power source interface coupled to the power source control component. The power source interface includes a single node that is coupled to the electronic device and that receives at least two signals from the electronic device, where one of the signals is a state signal and another of the signals is a serial communication signal. The power source interface also includes a switch circuit that generates a control signal for the power source control component based on the state signal, where the operation of the switch is capable of being affected by both the state signal and the serial communication signal. The power source interface further includes a switch buffer circuit that couples the single node to the switch circuit, where the switch buffer circuit includes an impedance network having a charge/discharge time constant that permits the state signal to affect the switch circuit and prevents the serial communication signal from affecting the switch circuit.

In a third embodiment of the invention, a method for signaling a power source control component is provided. The method includes receiving a state signal or a serial communication signal from an electronic device at a single node. The method also includes selectively allowing a switch circuit to be activated to permit a control signal to be passed to a power source control component if the state signal is received at the single node. The method further includes selectively preventing the serial communication signal from activating the switch circuit by holding the switch circuit in a non-active state if the serial communication signal is received at the single node using an impedance network having a charge/discharge time constant greater that a period of the serial communication signal and less than a period of the state signal.

BRIEF DESCRIPTION OF THE DRAWINGS

Embodiments of the present application will now be described, by way of example only, with reference to the attached Figures, wherein.

DETAILED DESCRIPTION

Figure 1:
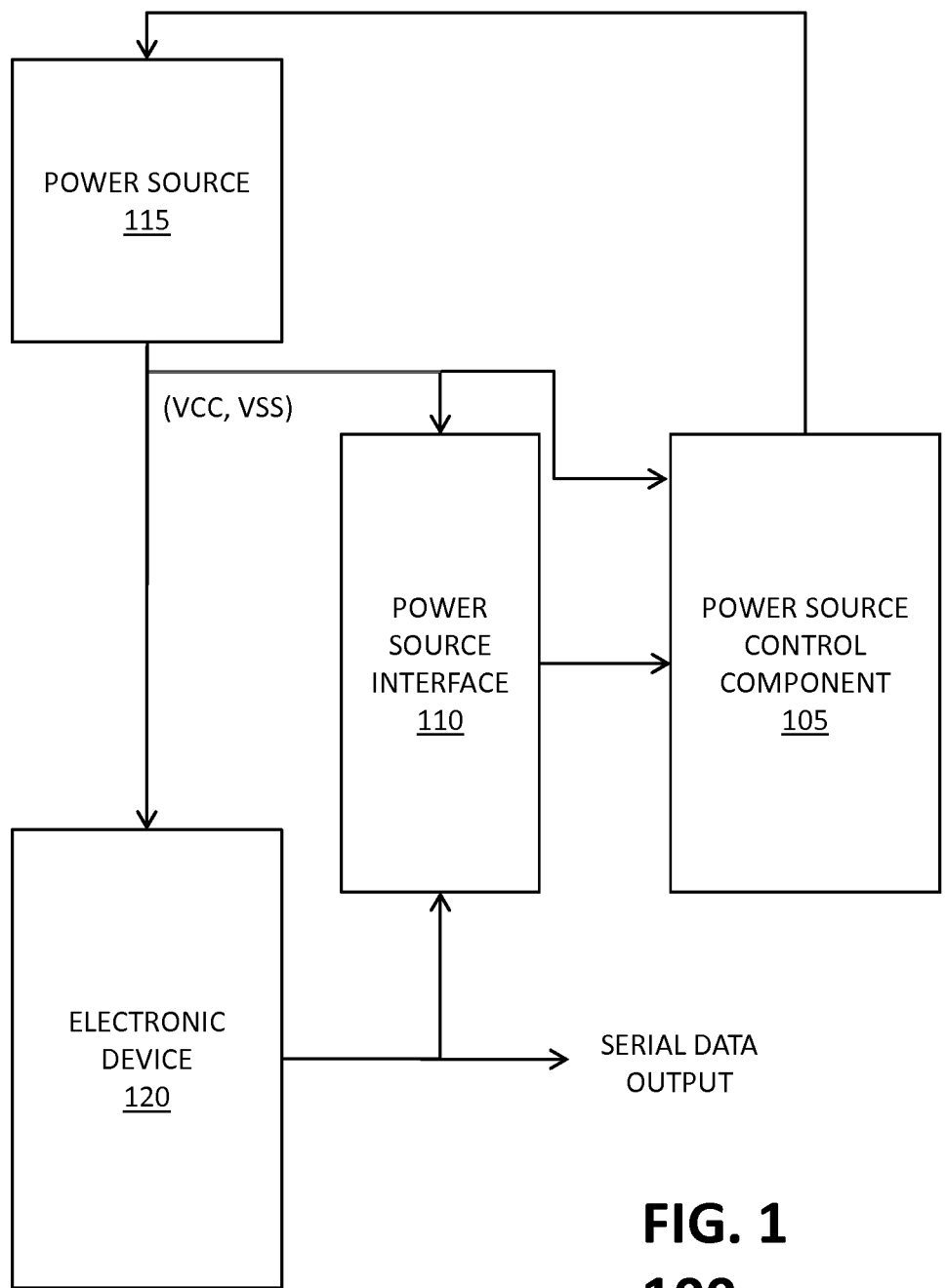
FIG. 1 is a block diagram of an exemplary system for controlling power to an electronic device in accordance with the various embodiments of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Several definitions that apply throughout this document will now be presented. The word "coupled" is defined as connected or integrated with, whether directly or indirectly through intervening components and is not necessarily limited to physical connections. The term "node" is defined as a terminal, connection point or junction of one or more signal paths, irrespective of whether the signal paths are inputs or outputs. A "state signal" is defined as a signal that provides an indication as to the state of an electrical device that is connected to a node. A "serial communication signal" is defined as a signal that includes at least some variation between high and low levels for the purpose of carrying operational information of an electrical device that is connected to the node. The word "switch" means a component or group of components that is placed in two or more states to control the operation or activation of some other component. The term "time-varying" means to vary or change with respect to time. A "power source" is defined as a component or group of components that provide power to another component or group of components. The terms "activate," "activating" or "activation" mean to initiate or to move from one state to another state. A "wake-up signal" is a signal that is intended to signal a component or group of components about a change in the state or condition of another component or group of components or is otherwise intended to relay information about the component or group of components.

The terms "interface" or "power source interface" are defined as a component or a group of components that are configured to facilitate the transfer of signals between two or more different devices or groups of devices. A "non-active state" is defined as a non-operational state or a state in which a component or group of components is shut down or is preventing the operation of some other component or group of components. The terms "toggle(s)" or "toggling" means to move between two or more different states or conditions. The term "high level" is defined as a threshold at or above which a component (or group of components) is activated or whose state is changed in response to an increase of some parameter of a signal. Conversely, the term "low level" is defined as a threshold at or below which a component (or group of components) is deactivated or whose state is changed in response to a decrease of some parameter of a signal.

As noted earlier, multiple contacts exist between batteries and the devices that receive power from the batteries. In addition, the number of these contacts has increased over the years. The additional contacts, while necessary, have led to a rise in manufacturing costs and present an increased opportunity for faults to occur. The various embodiments of the invention provide an interface that overcomes these disadvantages.

In the various embodiments of the invention, the interface can include a single node that can be configured to receive a state signal and a serial communication signal. The interface can also include a switch circuit and a switch control circuit, where the switch control circuit is capable of being influenced by the receipt of the state signal or the serial communication signal at the single node and can set the state of the switch circuit based on the receipt of the state signal. Additionally, a switch buffer circuit is coupled between the switch and the switch control circuit, where the switch buffer circuit is configured to prevent the serial communication signal from activating the switch circuit. As such, both the state signal and the serial communication signal can be transmitted over a single node without adversely affecting the operation of pre-existing components.

Referring to FIG. 1, a block diagram of an exemplary system 100 for controlling power to an electronic device in accordance with the various embodiments of the invention is shown. As shown in FIG. 1, system 100 includes a power source control component 105 and a power source interface 110. The system 100 can also include a power source 115 and an electronic device 120. The power source 115 can be configured to provide power to the electronic device 120, the power source interface 110 and the power source control component 105. For example, as shown in FIG. 1, the power source 115 can provide supply and reference voltages, VCC and VSS, to the various components of system 100.

The electronic device 120 can be communicatively coupled to the power source interface 110 and the power source interface 110 can be communicatively coupled to the power source control component 105. Further, the power source control component 105 can be communicatively coupled to the power source 115. In one embodiment of the invention, the electronic device 120 can signal the power source interface 110 when the electronic device 120 is activated or otherwise rendered in a state that requires power. The power source interface 110, in response, can signal the power source control component 105, which can control the power source 115 to permit the power source 115 to provide power to the electronic device 120.

The connection between electronic device 120 and power source power source interface 110 can also carry a serial communications data stream comprising operational information of the electronic device 120. In some embodiments, this operational information can be read at one or more nodes in system 100. For example, as shown in FIG. 1, can be read at a node between power source interface 110 and electronic device 120 without any adverse effect on the operation of the system 100. However, the various embodiments of the invention are not limited in this regard and the operational information can also be accessed at other points in system 100 without an adverse effect. For example, the node for accessing the operational data can be located within power source control component 105, power source interface 110 or elsewhere in system 100.

Figure 2:
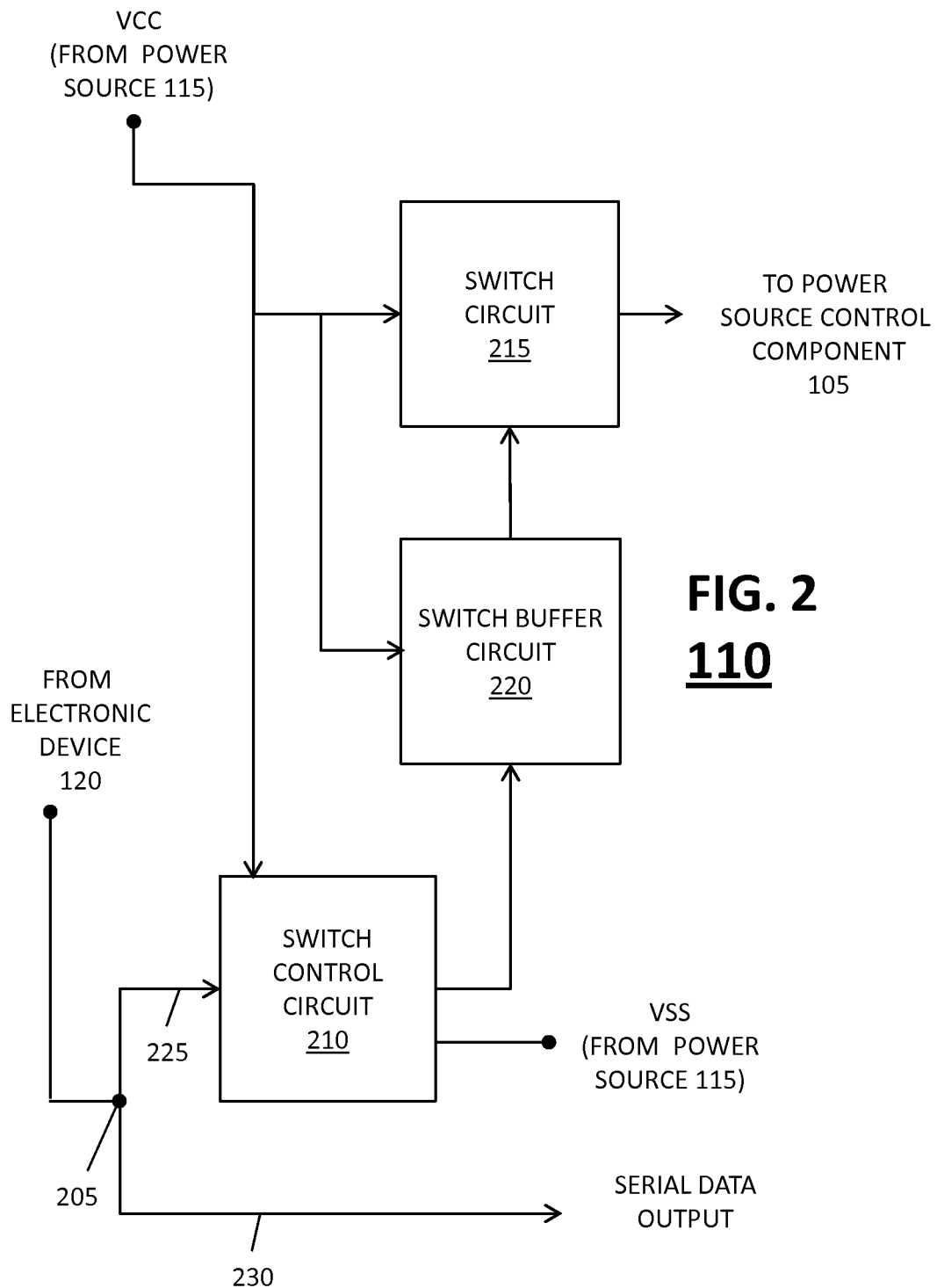
FIG. 2 is a block diagram of an a power source interface in FIG. 1.

As described above, the various embodiments of the invention use a power source interface to prevent serial communications from adversely affecting operation of system 100. Such a power source interface is shown in FIG. 2. FIG. 2 is an exemplary block diagram for power source interface 110 in accordance with an embodiment of the invention. As shown in FIG. 2, the power source interface 110 can include a node 205 communicatively coupled to an electronic device (such as device 120 in FIG. 1), a switch control circuit 210, a switch circuit 215 and a switch buffer circuit 220. A first signal path 225 can couple the node 205 to the switch control circuit 210, while a second signal path 230 can be used to read the serial data at node 205. The switch control circuit 210 can be coupled to the switch buffer circuit 220, which can be coupled to the switch circuit 215. The switch circuit 215, the switch buffer circuit 220, and the switch control circuit 210 can also be coupled to a supply voltage terminal (VCC) of the power source 115 in FIG. 1. The switch control circuit 210 can also be coupled to a reference voltage terminal (VSS) of the power source 115 in FIG. 1 to provide a ground or reference voltage for interface 110.

In the exemplary embodiment shown in FIG. 2, the node 205 can be configured to receive a state signal and a serial communication signal. As described above with respect to FIG. 1, these signals can be received from the electronic device 120. However, the various embodiments of the invention are not limited in this regard and node 205 can be arranged to receive signals from other components, as well. The state signal and the serial communication signal can be received at separate times, although as an alternative, they can be received simultaneously and various steps can be taken to identify both signals and distinguish them from one another in this instance.

In one embodiment of the invention, the state signal can identify a state of the electronic device 120. For example, in some embodiments of the invention, a high state signal (i.e., a non-zero voltage at node 205) can indicate that the electronic device 120 is in a sleep mode or a disabled/off condition in which the electronic device 120 requires little or no power. In such embodiments, the non-zero voltage can be provided at node 205 by applying a voltage greater than VSS at node 205 or by allowing node 205 to float, as described below. In contrast, a low state signal can identify that the electronic device 120 is in an awake mode or an active condition that calls for additional power. In such embodiments, the low-state signal voltage can be provided at node 205 by applying a zero or reference voltage at node 205, as described below. However, the various embodiments of the invention are not limited in this regard and these signals can be reversed such that a high state signal indicates a need for increased power, while a low state signal signifies little or no power is needed.

The serial communication signal can be used to relay data from the electronic device 120 to other components, such as the power source control component 105. Although intended to travel along the second signal path 230 to the power source control component 105, a serial communication signal at node 205 can also reach the switch control circuit 210 through the first signal path 225. In some embodiments of the invention, the serial communication signal can be a time-varying signal having a high level and a low level, and the resultant periodicity of the signal can be used to transmit data about the electronic device 120 to the control component 105. In one specific arrangement, the serial communication signal can have a first state and a second state. In the first state, the serial communication signal remains at a high level, such as when no data is being transmitted. In the second state, the serial communication signal can toggle between the high and low levels, such as when data is being passed. It is understood, however, that other modulation schemes can be employed to transfer data from the electronic device 120 to the power source control component 105.

Figure 3:
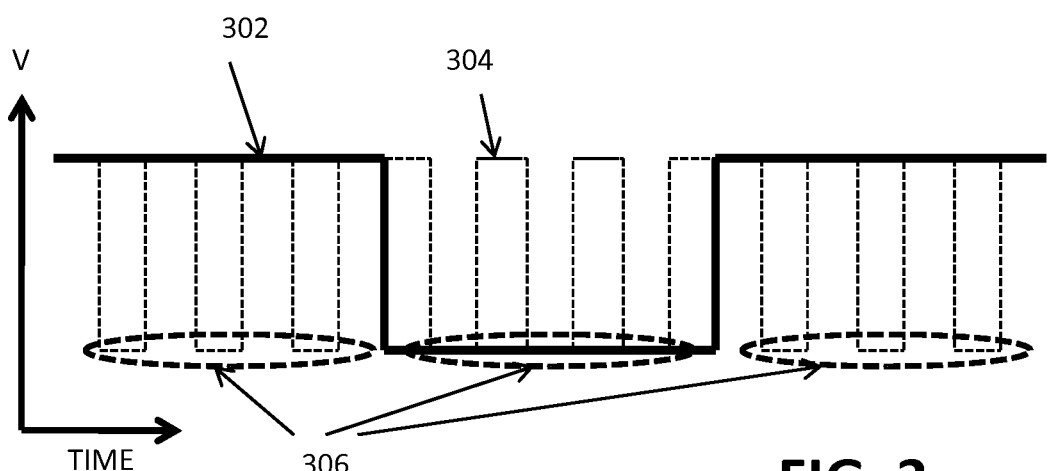
FIG. 3 is a schematic of an exemplary input signal.

In the various embodiments of the invention, the switch control circuit 210 is configured to generate a signal for activating switch circuit 215 based on the signal at node 205, such as that shown in FIG. 3. FIG. 3 is a schematic of an exemplary input signal 300 for switch control circuit 210. As shown in FIG. 3, the input signal 300 includes a low frequency state signal 302 (as indicated by the solid lines). The switch control circuit 210 is configured to permit the state signal 302 to activate or set the switch circuit 215 when the state signal is a low state signal Alternatively, the state signal may deactivate the switch circuit 215 when the state signal 302 is a high state signal. Thus, when the switch circuit 215 is activated, the switch circuit 215 can signal a device, such as power source control component 105 in FIG. 1, to indicate that the electronic device 120 has entered an active or awake state and requires power. In response, the control component 105 can control the power source 115 to permit the increase in power. If the switch circuit 215 is deactivated, such as when the state signal 302 is a high state signal, the switch circuit 215 again signals the control component 105, and the control component 105 can accordingly adjust the power source 115 to reduce or stop the provided power.

However, at any one time, the signal at node 205 can comprise either the state signal or the serial communication signal. For example, the input signal 300 can also include a serial communications signal 304, as shown in FIG. 3 (dotted lines), that varies between high and low levels at a higher frequency that state signal 302. In a conventional arrangement, such variation (i.e., the low levels 306 in signal 304) can cause the switch control circuit 210 to generate signals for activating switch circuit 215. Therefore, in the various embodiments of the invention, the switch control circuit 210 and the switch circuit 215 are coupled via switch buffer circuit 220. The switch buffer circuit 220 is configured to selectively activate switch circuit 215 in response to the state signal 302 and not in response to the serial communications signal 304. In particular, since the serial communications signal 304 consists of a time-varying signal, having a higher frequency as compared to the state signal 302, the switch buffer circuit 220 can be configured to allow only changes in switch control circuit 210 occurring at low frequencies to influence switch circuit 215.

In the various embodiments of the invention, the power source interface 110 can be configured in a variety of ways to provide the above-described functions. In particular, the switch buffer circuit 220 can consist of an impedance network having a charge/discharge time constant greater that a frequency of the serial communication signal. Thus, the slower charging and discharging rates of such a network prevents a high frequency signal, such as the serial communications signal at node 205, from affecting the control signal for the switch circuit 215. This is described below in greater detail with respect to FIG. 4.

Figure 4:
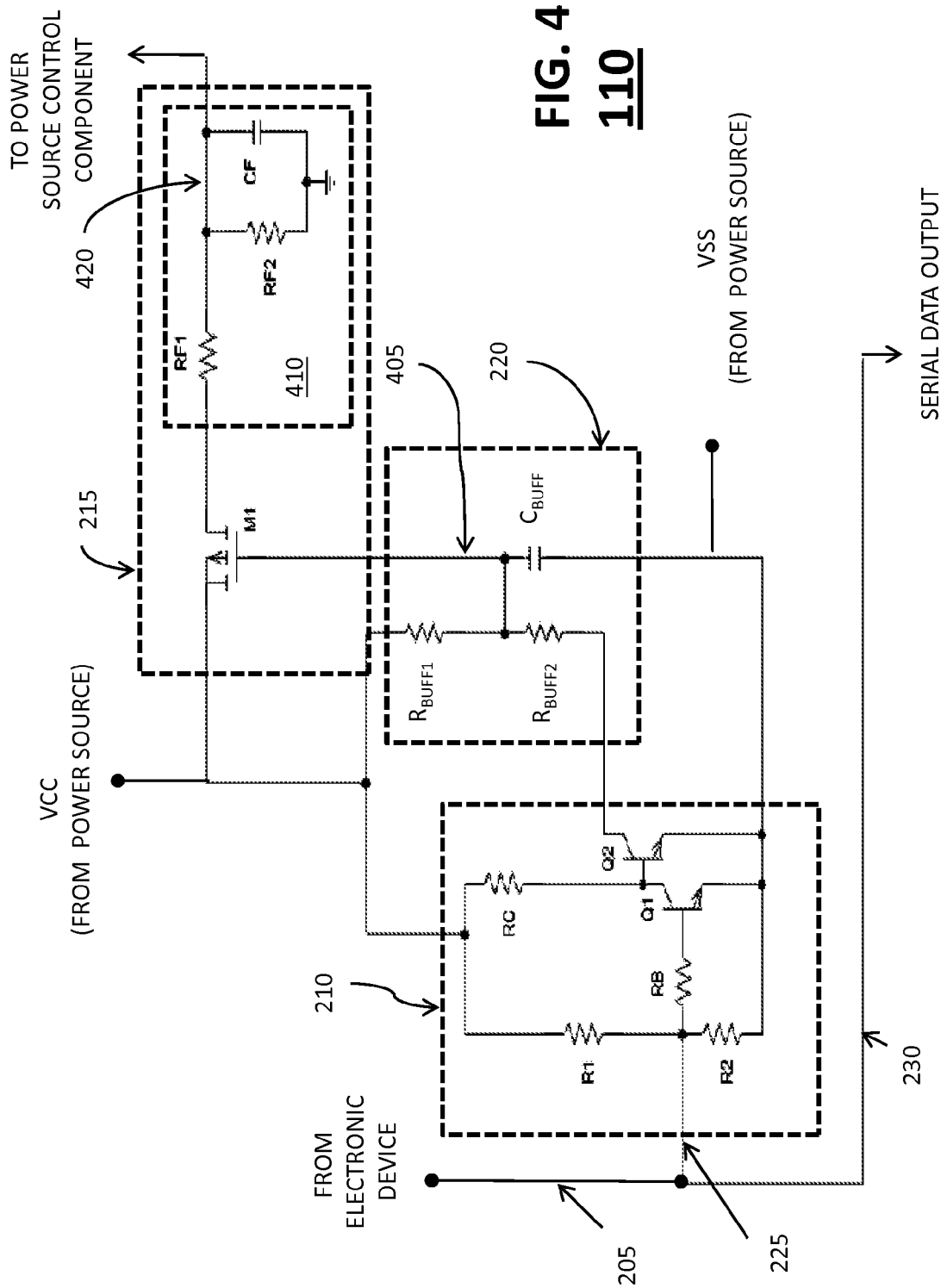
FIG. 4 is a detailed block diagram of a first exemplary configuration for the power source interface of FIG. 2.

A preferred configuration for the power source interface 110 is shown in FIG. 4. FIG. 4 is a detailed block diagram of a preferred configuration for the power source interface 110 of FIG. 2. As shown in FIG. 4, interface 110 includes a switch control circuit 210, a switch circuit 215, and a switch buffer circuit 220 therebetween, as described above with respect to FIG. 2.

As described above, the switch control circuit 210 is configured to receive signals from node 205 via signal path 225 and generate a signal for switch circuit 215. In the exemplary embodiment shown in FIG. 4, the switch control circuit 210 essentially comprises a two-stage bipolar junction transistor (BJT) cascade amplifier. This cascade amplifier consists of first and second NPN BJT's, Q1 and Q2, where the collector node of Q1 is coupled to the base node of Q2. Further, the emitter nodes of Q1 and Q2 are tied together and coupled to VSS. To bias Q1, resistors R1, R2, RB, and RC are provided in circuit 210 of FIG. 4. RC couples the collector node of Q1 to VCC. RB couples the base node of Q1 to node 205 via signal path 225. Further, signal path 225 is coupled to VCC via bias resistor R1 and to VSS via bias resistor R2. The output of switch control circuit 210 in FIG. 4 is provided at the collector node of Q2, which is coupled to the switch buffer circuit 220.

Circuit 210 in FIG. 4 operates as follows to generate a signal for switch circuit 215. When a signal at node 205 is high or floating (i.e., node 205 is an open), a voltage difference develops between the base and emitter nodes of Q1. In the case of a high at node 205, a voltage is developed at the base node of Q1, comprising the voltage divider of RB and the input resistance of Q1. As a result, a voltage develops between the base and emitter nodes of Q1, turning Q1 on. Similarly, in the case of node 205 floating, a voltage develops at the base node of Q1, comprising the voltage divider of VCC based on R1, R2, RB, and the input resistance of Q1. Again, a voltage develops between the base and emitter nodes of Q1, turning Q1 on.

As Q1 turns on, the base of Q2 is shorted to VSS. As a result, both the emitter and base nodes of Q2 are at VSS. Therefore, since no voltage difference exists between the emitter and base nodes of Q2, Q2 is turned off and the output of circuit 210 (i.e., the collector node of Q2) in FIG. 4 is floating. As Q1 turns off, a voltage develops at the base node of Q2, comprising the voltage divider of VCC based on RC and the input resistance of Q2. As a result, a voltage develops at the base node of Q2 that is greater than VSS. Thus, the resulting voltage difference between the emitter and base nodes of Q2 turns Q2 on, shorting the collector node of Q2 to VSS.

As described above, the collector node of Q2 provides the output of circuit 210 in FIG. 4. However, the switch control circuit 210 responds to any changes at node 205. Thus, even when the state signal is being maintained at a low or a high level, the higher frequency alternating of the serial communications signal between a low level and high level would cause the state of the collector node of Q2 to toggle incorrectly. As a result, if switch control circuit 210 is directly connected to switch circuit 215, the serial communications signal would incorrectly toggle switch circuit 215 and cause the power source control component to receive an incorrect signal. Accordingly, switch buffer circuit 220 is provided to respond to low frequency changes in the state signal and ignore the high frequency changes in the serial communications signal.

As shown in FIG. 4, switch buffer circuit 220 comprises a resistor-capacitor network coupled between VCC, VSS, the collector node of Q2 and the input node 405 for switch circuit 215. This resistor-capacitor network includes a first resistor $R_{BUFF1}$ coupling the collector node of Q2 and input node 405, a second resistor $R_{BUFF2}$ coupling VCC to input node 405, and a capacitor $C_{BUFF}$ coupling VSS to input node 405.

In operation, circuit 220 of FIG. 4 operates as follows. When Q2 is off, the collector node of Q2 is floating. As a result, the circuit path between VCC and VSS through circuit 220 of FIG. 4 is thorough $R_{BUFF1}$ and $C_{BUFF}$. Accordingly, while Q2 is off, VCC is operative to charge capacitor $C_{BUFF}$. Once $C_{BUFF}$ is fully charged, it appears as an open circuit and thus a non-zero voltage is generated at input node 405. When Q2 is on, the collector node of Q2 is effectively shorted to VSS. Accordingly, the voltage at input node 405 would normally drop to a voltage based on the voltage divider between $R_{BUFF1}$ and $R_{BUFF2}$. However, $C_{BUFF}$ initially holds the input node 405 at a non-zero voltage and at least initially limits the rate at which the voltage at input node 405 drops according to the time constant of the resistor-capacitor network in circuit 220. As a result, if Q2 is not held on for a sufficient amount of time, there is insufficient time to significantly discharge $C_{BUFF}$ and the voltage at input node 405 is not significantly altered. Consequently, the signal for switch circuit 215 at node 405 would not be affected and switch circuit 215 would not toggle.

In the various embodiments of the invention, the values of $R_{BUFF1}$, $R_{BUFF2}$, and $C_{BUFF}$ can be selected to hold input node 405 at VCC for a range of frequencies for switching Q2 on and off (i.e., for a range of frequencies associated with different serial communications signals). For example, in one embodiment of the invention, values of 400 kΩ, 100 kΩ, and 2.7 nF for $R_{BUFF1}$, $R_{BUFF2}$, and $C_{BUFF}$, respectively, are sufficient to prevent a serial communications signal of ~30 kHz or higher from affecting a voltage at input node 405. However, the various embodiments of the invention are not limited in this regard and any other values can be used to prevent other serial communication signals at other frequencies from affecting the signal at input node 405.

As described above, switch circuit 215 in FIG. 4 is configured to operate responsive to the voltage at input node 405 in order to output a high or low signal. In the embodiment illustrated in FIG. 4, circuit 215 comprises an enhancement mode PMOS transistor M1 (i.e., having source and body contacts tied together) having a gate node coupled to input node 405, a source node coupled to VCC and a drain node coupled to an output node 420 via a filter circuit 410. The filter circuit 410 comprises a resistor $R_{F1}$ coupled between the drain node of M1 and output node 420, which is coupled to power source control component 105 of FIG. 1. The filter circuit further comprises a resistor $R_{F2}$ and capacitor $C_F$, coupled in parallel between node 420 and a ground or reference voltage, such as VSS.

In operation, switch circuit 215 in FIG. 4 operates as follows. When Q2 is on, the voltage divider $VCC \times R_{BUFF2}/(R_{BUFF1}+R_{BUFF2})$ causes a voltage less than VCC to develop at node 405. Thus, the signal at input node 405 is low and M1 is turned on since the gate-source voltage ($V_{GS}$) for M1 is greater than zero ($V_{GS} \neq 0$). Thus, VCC is coupled to output node 420 via filter circuit 410 and a non-zero voltage is provided at node 420 and the power source control circuit beyond, where the voltage at node 420 is based on the voltage divider provided by filter circuit 410. In the various embodiments of the invention, the filter circuit 410 can be configured to provide a voltage signal 420 corresponding to the appropriate voltage levels for power source control component. Such configuring is well-known to those of ordinary skill in the art and will not be described here. When Q2 is off, $R_{BUFF2}$ and $C_{BUFF}$ effectively appear as open circuits, as described above, and $R_{BUFF1}$ ties the source and gate of M1 together and to the same voltage. Thus, M1 is turned off since $V_{GS}=0$ via $R_{BUFF1}$. As a result, node 405 is effectively shorted to ground via resistor RF2, providing a low signal for power source control component 105 in FIG. 1.

Although example in FIG. 4 is configured to utilize a low level signal at node 205 to activate or set switch circuit 215, the various embodiments of the invention are not limited in this regard. For example, the power source interface 110 can also be arranged such that the activation of the switch circuit 215 is instead caused by a high level state signal at the node 205. Such a configuration for power source interface 115 is shown in FIG. 5.

Figure 5:
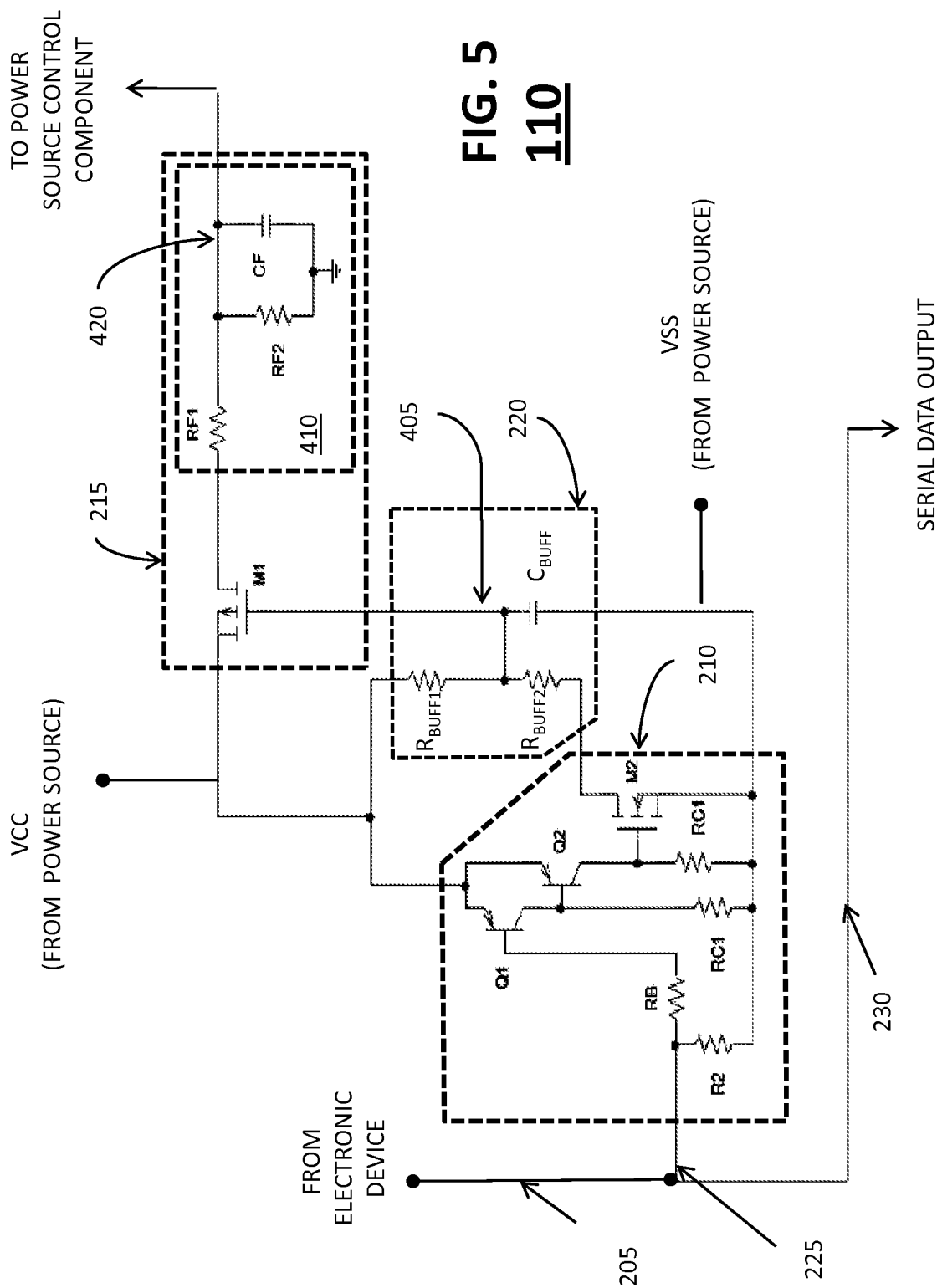
FIG. 5 is a detailed block diagram of a second exemplary configuration for the power source interface of FIG. 2.

As shown in FIG. 5, a power source interface 115 is provided that is substantially similar to that shown in FIG. 4. In particular, the configuration of the switch circuit 215 and the switch buffer circuit are substantially similar. Thus, the description above in FIG. 4 is sufficient for purposes of describing the structure and operation of these circuits in FIG. 5. However, to manage a high level signal to indicate that an electronic device is in an awake mode or an active condition, some modifications to circuit 210 can be provided, as shown in FIG. 5.

As described above, the switch control circuit 210 is configured to receive signals from node 205 via signal path 225 and generate a signal for switching switch circuit 215. In the exemplary embodiment in FIG. 5, the switch control circuit 210 also comprises a two-stage bipolar junction transistor (BJT) cascade amplifier. The cascade amplifier in FIG. 5 consists of first and second PNP BJT's, Q1 and Q2, where the collector node of Q1 is coupled to the base node of Q2. Further, the emitter nodes of Q1 and Q2 are tied together and coupled to VCC. To bias Q1, resistors R2, RB, and RC1 are provided in circuit 210 of FIG. 5. RC1 couples the collector node of Q1 to VSS. RB couples the base node of Q1 to node 205 via signal path 225. The output of switch control circuit 210 in FIG. 5 is provided by an enhancement mode NMOS transistor M2 (i.e., having source and body contacts tied together) having a gate node coupled to the collector node of Q2, which is coupled to VSS via a resistor RC2. The source node of M2 is coupled to VSS and the drain node is coupled to switch buffer circuit 220.

Circuit 210 in FIG. 5 operates as follows to generate a signal for switch buffer circuit 220 and switch circuit 215. When a signal at node 205 is low, indicating an inactive state, a voltage difference develops between the emitter and base nodes of Q1, turning Q1 on. Thus, the collector node of Q1 and the base node of Q2 are effectively shorted to VCC. As the base node of Q2 approaches VCC, Q2 is turned off. Consequently, the collector node of Q2 is effectively coupled to VSS and provides a low signal at the gate node of M2, turning M2 off. As a result, the drain node of M2 is floating and VCC can charge $C_{BUFF}$ in circuit 220, as described above with respect to FIG. 4. The charging of $C_{BUFF}$ provides a voltage greater than VSS at node 405, which turns off M1 and sets node 420 to a low level, as previously described with respect to FIG. 4.

When a signal at node 205 is high, indicating an active state, little or no voltage difference is provided between the base and emitter nodes of Q1. As a result, Q1 is turned off. As Q1 turns off, the base node of Q2 is shorted to VSS. As a result, a voltage difference is developed between the emitter and base nodes of Q2 and Q2 is turned on. Consequently, the gate node of M2 is effectively shorted to VCC and M2 turns on. Since the drain node of M2 is shorted to VSS, this allows $C_{BUFF}$ in circuit 220 to be discharged, which in turn turns on M1 and sets node 420 to a high level, as previously described with respect to FIG. 4.

In the exemplary configuration in FIG. 5, switch buffer circuit 220 continues to prevent switch circuit 215 from responding to changes switch control circuit 210 due to the serial communication signal. That is, as M2 is switched on and off by the higher frequency serial communication signal, M1 is not inadvertently turned on. That is, since $C_{BUFF}$ discharges according to the time constant of the switch buffer circuit 220, as described above, the voltage at node 405 will not respond to changes in the switch control circuit 210 responsive to the high frequency serial communications signal. Accordingly, the power source control component can continue to receive a low signal when the state signal at node 205 is low, regardless of the variations in the serial communications signal.

Portions of the system 100 and supporting components can take the form of hardware elements, software elements or elements containing both hardware and software. In one embodiment, the software portions can include, but are not limited to, firmware, resident software, microcode, etc. Furthermore, these software portions can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. Both processors and program code for implementing each as aspect of the system can be centralized or distributed (or a combination thereof) as known to those skilled in the art.

A data processing system suitable for storing program code and for executing program code, which can be implemented in any of the above-referenced devices described herein, can include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. I/O devices (including but not limited to keyboards, displays, pointing devices, etc.) can be coupled to the system either directly or through intervening I/O controllers.

Applicants present certain theoretical aspects above that are believed to be accurate that appear to explain observations made regarding embodiments of the invention based primarily on solid-state device theory. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Other configurations are also possible. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An interface for coupling an electronic device to a power source control component, the electronic device providing a state signal and a serial communication signal, comprising:
 a single node coupled to the electronic device, the single node receives the state signal and the serial communication signal from the electronic device;

a switch circuit which provides a control signal for the power source control component, the switch circuit having a plurality of states each of which alter the control signal provided to the power source control component, the switch circuit capable of switching states by the receipt of the state signal and the serial communication signal at the single node; and a switch buffer circuit, an input of the switch buffer circuit being coupled to the single node and an output of the switch buffer circuit being coupled to the switch circuit, the switch buffer circuit comprising an impedance network having a charge/discharge time constant configured to selectively cause the switch circuit to switch states in response to the state signal being received at the single node and to prevent the switch circuit to switch states in response to the serial communication signal being received at the single node.

2. The interface according to claim 1, wherein the serial communication signal is a time-varying signal having a high level and a low level, wherein the switch buffer circuit is configured to prevent the serial communication signal from activating the switch circuit when the state signal deactivates the switch circuit.

3. The interface according to claim 2, wherein a frequency of the time varying signal is substantially higher than a frequency of change in the state signal.

4. The interface according to claim 3, wherein the impedance network comprises a resistor-capacitor network having a time constant that is greater than a period of the time varying signal and less than a period of a variation in the state signal.

5. The interface according to claim 1, further comprising a switch control circuit coupled to the electronic device through the single node, the switch control circuit receives the state signal from the electronic device through the single node and receives the serial communication signal from the electronic device through the single node, an output of the switch control circuit being controlled by the receipt of the state signal from the electronic device through the single node and the output of the switch control circuit being controlled by the receipt of the serial communication signal from the electronic device through the single node, the input of the switch buffer circuit being coupled to the single node through the switch control circuit.

6. The interface according to claim 5, wherein the switch control circuit selectively determines a condition for the switch buffer circuit.

7. The interface according to claim 1, wherein the interface is coupled to a power source and the power source provides charge to the switch buffer circuit.

8. The interface according to claim 1, further comprising at least two signal paths coupled to the single node, wherein a first path couples the single node to the switch control circuit and a second path couples the single node to a different node.

9. The interface according to claim 8, wherein the serial communication signal has a first state and a second state, wherein during the first state, the serial communication signal is at the high level and during the second state, the serial communication signal toggles between the high level and the low level.

10. The interface according to claim 1, wherein the state signal is a wake-up signal that signals the power source control component that the electronic device requires power.

* * * * *